United States Patent [19]

Munt et al.

[11] 4,303,880

[45] Dec. 1, 1981

[54] GATED PRECISION OFFSET CIRCUIT FOR A DIGITAL METER HAVING A DUAL SLOPE ANALOG-TO-DIGITAL CONVERTER

[75] Inventors: Irwin Munt, Springfield; Philip Emile, Jr., Roseland; John G. Walden, Houston, all of Tex.

[73] Assignee: Sangamo Weston, Inc., Norcross, Ga.

[21] Appl. No.: 79,310

[22] Filed: Sep. 26, 1979

[51] Int. Cl.³ .................. G01R 17/06; H03K 1/02; H03K 13/02
[52] U.S. Cl. .................. 324/99 D; 324/111; 324/130; 340/347 NT; 340/347 CC
[58] Field of Search ............. 324/99 D, 130, 111; 340/347 NT, 347 CC

[56] References Cited

U.S. PATENT DOCUMENTS 4,082,998 4/1978 Marriott ............... 324/130

Primary Examiner—Ernest F. Karlsen
Attorney, Agent, or Firm—Joseph J. Kaliko; Mikio Ishimaru; Dale V. Gaudier

[57] ABSTRACT

An offset circuit for use in providing an offset signal to an analog-to-digital converter. The analog-to-digital converter has an integrator for performing signal integrate operations and is connected to a digital display. The offset circuit is gated to provide a variable offset current directly to the integrator of the analog-to-digital converter, thereby eliminating adverse loading effects on the high input impedance of the analog-to-digital converter.

7 Claims, 2 Drawing Figures

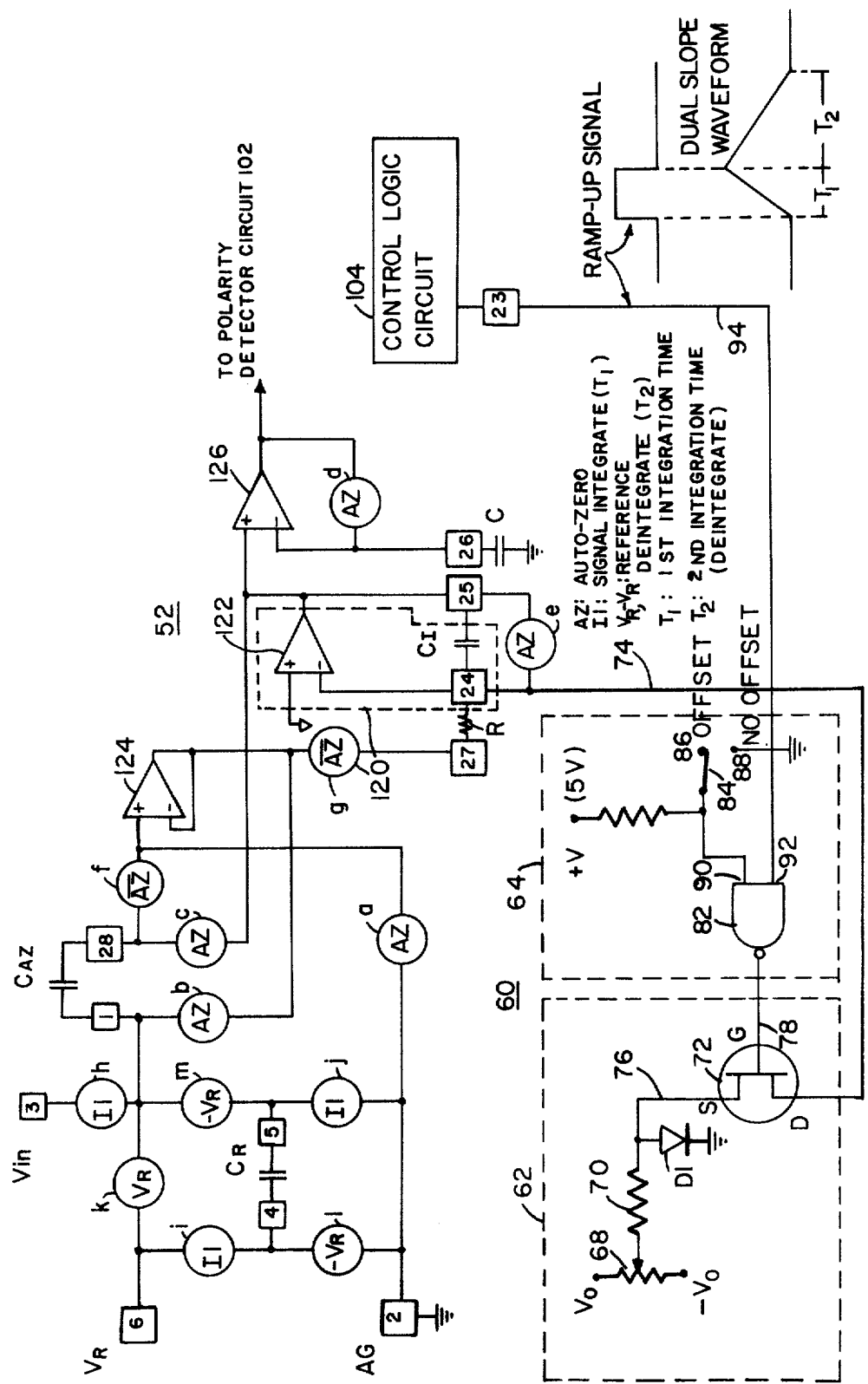

4,303,880

GATED PRECISION OFFSET CIRCUIT FOR A DIGITAL METER HAVING A DUAL SLOPE ANALOG-TO-DIGITAL CONVERTER

BACKGROUND OF THE INVENTION

1. Field of the Invention

The invention is in the field of offset circuits for use, for example, in digital meters employing a dual slope analog-to-digital converter.

2. Description of the Prior Art

Prior art offset circuits have been utilized in digital meters to provide an offset voltage or current to the input of an analog-to-digital converter which is subsequently connected to a display output. These prior art devices generally require complex and expensive additional circuitry, such as a difference amplifier connected for subtracting out or adding a variable offset voltage or current to the input signal which feeds the analog-to-digital converter. Many of these devices have the inherent disadvantages of adversely loading the input impedance of the analog-to-digital converter which preferably has a high input impedance on the order of 100 megohms. High input impedance differential amplifier circuits are expensive, and thus have found only restricted use in offset circuits.

SUMMARY OF THE INVENTION

It is an object of the invention to overcome the disadvantages of the prior art by providing a simple and inexpensive offset circuit which has virtually no effect on the input impedance of the analog-to-digital converter.

It is a more specific object of the invention to provide an offset current directly to the integrator of a dual slope analog-to-digital converter during the signal integrate period of operation of the converter. The offset circuit is, furthermore, gated to be added directly to a summing junction of the integrator of the analog-to-digital converter during the ramp-up or signal integrate period.

The invention may be defined as an offset circuit for use in providing an offset current to a dual slope analog-to-digital converter wherein the converter has an integrator for performing signal integrate and reference deintegrate operations. The offset circuit comprises a means for generating an offset current and a means for connecting the offset current to the input of the integrator. More specifically, the offset circuit further comprises gate means for enabling connection of the offset current only during the signal integrate operation of the integrator.

The offset circuit may be most advantageously employed in a digital meter and the invention may be characterized as a digital meter having a dual slope analog-to-digital converter, a display means, an offset circuit and a means for connecting the offset circuit to an integrator of the analog-to-digital converter. More specifically, the dual slope analog-to-digital converter comprises an input terminal for receiving an analog input signal to be measured, means for generating the reference signal, an integrator having an input for receiving the analog input signal and the reference signal wherein the integrator provides a dual slope output in response to the analog input signal and the reference signal, and a digital circuit means for providing a digital output in response to the dual slope output of the integrator. The digital output corresponds in magnitude to the analog input signal. The display means is connected to receive the digital output signal for providing a digital readout thereof, and the offset circuit has an offset current means for providing an offset current. The digital meter further comprises means for directly connecting the offset current as an input to the integrator.

The offset circuit provides a variable offset current directly to the integrator of the analog-to-digital converter, thereby eliminating adverse loading effects on the high input impedance of the converter and permits offset by a fixed number of offset counts for the digital output independent of variations in input impedance.

BRIEF DESCRIPTION OF THE DRAWINGS

These and other objects of the invention are more further described in reference to the following description taken in conjunction with the drawings, wherein:

FIG. 2 is a more detailed schematic diagram of the offset circuit interconnected to the integrator of the dual slope analog-to-digital converter.

DETAILED DESCRIPTION OF THE PREFERRED EMBODIMENT

Figure 1:
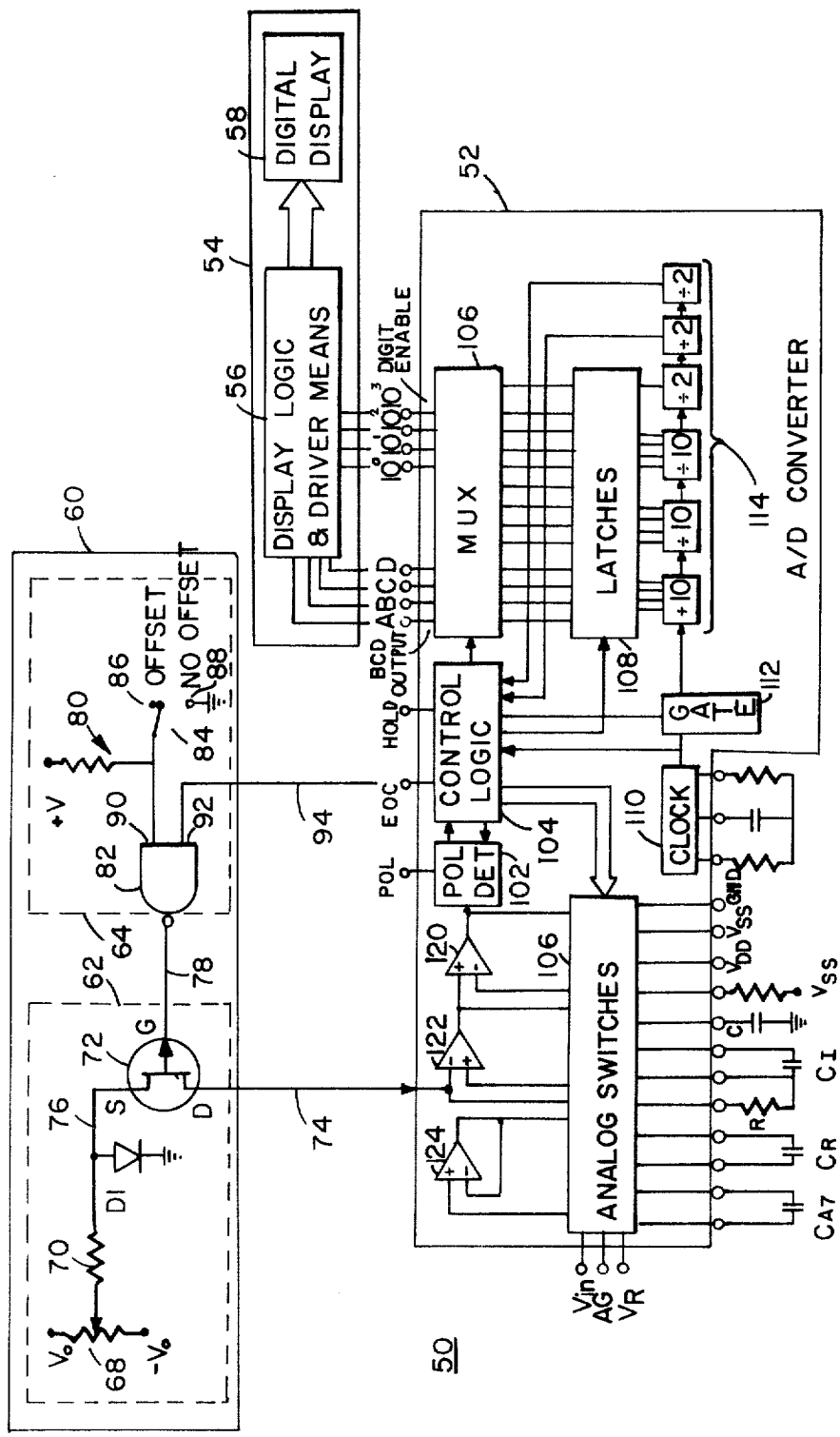
FIG. 1 is an overall block diagram of a digital meter employing the offset circuit.

FIG. 1 is a block diagram of a digital meter 50 utilizing an offset circuit in accordance with the principles of the invention. The digital meter 50 comprises an analog-to-digital converter 52 and a digital output means 54. The digital output means may itself comprise a display logic and driver means 56 connected to a digital display 58. In accordance with the invention, an offset circuit 60 is interconnected to the analog-to-digital converter for providing an offset current directly to an integrator of the analog-to-digital converter. The offset circuit is seen to comprise a variable current source 62 and a gate means 64 for interconnecting the variable current source to the analog-to-digital converter. Variable current source 62 comprises a variable voltage means shown more specifically as a variable resistor 68 connected between a $V_0$, $-V_0$ voltage source and a fixed resistor 70. Resistor 70 is utilized to convert the offset voltage from voltage source 68 into an offset current. The variable current source 62 further comprises a field-effect-transistor (FET) 72 having a source terminal S, a drain terminal D and a gate terminal G. (In many FET's, the source S and drain D are symmetrical and thus not distinguished one from the other.) The drain terminal of the FET is connected to the analog-to-digital converter 52 via a line 74. The source terminal of the FET 72 is connected to the fixed resistor 70 of the variable current source 62 via a line 76. The gate terminal G of the FET 72 is connected to the gate means 64 via a line 78. In the circuit operation, FET 72 serves as a switch controlled by gate means 64. A diode D1 connects the juncture of resistor 70 and FET 72 to ground to insure that only gate means 64 is able to control the switching action of FET 72.

Gate means 64 comprises a logic voltage means 80, a NAND gate 82 and a switch means 84. Switch means 84 may be connected to a first terminal 86 to permit gating of the offset current from the variable current source to the analog-to-digital converter 52 via the line 74 and may be connected to a second terminal 88 to prevent connection of the variable offset current to the analog-to-digital converter 52. NAND gate 82 has a first input 90 connected to the switch means 84 and a second input 92 connected to the analog-to-digital converter via a line 94.

The analog-to-digital converter 52 may be of a conventional dual slope type as, for example, Model MP7138A manufactured by Micro Power Systems, Inc., Santa Clara, Calif. For ease of description in FIGS. 1 and 2, the input and output terminals of the analog-to-digital converter are labeled consistently with the manufacturer's data sheet for the above-referenced A/D converter. The A/D converter is seen to comprise a plurality of analog switches 100, a polarity detection circuit 102, a control logic circuit 104, a digital multiplexer 106, a plurality of latches 108, a clock means 110, gate 112 and a plurality of division circuits 114. The division circuits 114 in combination with the plurality of latches 108 and the digital multiplexer 106 enable a sequential actuation of the digits of the digital display 58. The digital multiplexer 106 is specifically adapted for use in a 3-½ digital display, and control logic circuit 104 contains the binary counter utilized for counting clock pulses from the clock means 110 during a signal integrate and reference source deintegrate operation. The analog input signal to be measured is fed to the analog switches 100 via the input terminal $V_{in}$ and the reference voltage source via the terminal $V_R$. The input terminal AG is utilized as an analog input ground for the unknown input voltage $V_{in}$ and the reference voltage $V_R$. As well known in the art of dual slope integration, the unknown analog input voltage is integrated for a fixed time determined by a fixed number of counts in the binary counter of the control logic circuit 104. Subsequent to this integration operation, a reference voltage, opposite in polarity from the input signal voltage, is utilized to discharge the previously charged integration capacitor during a "deintegrate" operation. The time required for the deintegration is measured on the binary counter of the control logic circuit 104 and is proportional to the magnitude of the input analog voltage $V_{in}$.

In order to achieve the required integration and deintegration, the analog-to-digital converter is provided with an integrator 120 (see FIG. 2) in the form of an amplifier 122 and integration capacitor $C_I$. A resistor R is provided which serves to convert signal and reference voltages to signal and reference currents prior to integration. The analog-to-digital converter 52 is further seen to comprise a buffer amplifier 124, comparator 126, auto-zero capacitor $C_{AZ}$, reference capacitor $C_R$ and noise suppression/auto-zero capacitor C. Input terminals are also provided for the positive supply voltage $V_{DD}$ and the negative supply voltage $V_{SS}$. The GND input terminal is utilized for digital ground and is generally connected to the analog ground AG input terminal.

FIG. 2 illustrates a more detailed schematic diagram of the invention specifically illustrating the offset circuit 60 and its interconnection to the integration amplifier 122 and analog switches 100. There are basically three phases of operation, an auto-zero (AZ) phase wherein the auto-zero capacitors $C_{AZ}$ and C are charged to compensate for voltage offsets in the various amplifiers (buffer amplifier and comparator), a first integration phase (I1) wherein the input analog voltage $V_{in}$ is integrated, and a deintegration stage wherein a reference voltage ($V_R$ or $-V_R$) is utilized in a deintegration stage. In FIG. 2, the analog switches 100 are illustrated as being closed during the phase indicated within the switch circle. For example, during the auto-zero phase all switches identified as AZ are closed; during the first integration phase all switches identified as I1 are closed; and during the second integration or deintegration phase all switches indicated as $V_R$ or $-V_R$ are closed. The switch $\overline{AZ}$ is closed during all non-auto-zero phases of operation.

In order to better illustrate the operation of the invention, all of the analog switches are identified with a letter designation a, b, c, etc.

Further, the input and output terminals for the analog-to-digital converter are represented by square blocks having numerical indications identical with those utilized by the manufacturer of the Model 7138A converter.

During the auto-zero phase of operation, all switches AZ are closed and a closed auto-zero loop is developed around the entire system through switch AZ-a, buffer amplifier 124, switch AZ-b, auto-zero capacitor $C_{AZ}$, switch AZ-c, comparator 126, switch AZ-d and noise suppression/auto-zero capacitor C. Additionally, the integration capacitor $C_I$ is discharged via the switch AZ-e. Further, during the auto-zero phase the switches $\overline{AZ}$-f and $\overline{AZ}$-g are open.

During the first or signal integration phase of operation the input signal $V_{in}$ at input terminal 3 is converted into a current via resistor R connected between terminals 26 and 27 and utilized to charge the integration capacitor $C_I$ connected between terminals 25 and 26. A signal path is thus developed through the switch I1-h, through the auto-zero capacitor $C_{AZ}$, switch $\overline{AZ}$-f, buffer amplifier 124, switch $\overline{AZ}$-g, resistor R, integrator 120 (amplifier 122 and integration capacitor $C_I$) and comparator 126. The output of comparator 126 is fed to the polarity detection circuit 102 illustrated in FIG. 1.

The input signal $V_{in}$ is thus utilized to charge the integration capacitor $C_I$ during the first integration phase which is, as previously explained, maintained for a predetermined fixed time interval as determined by the binary counter of the control logic circuit 104.

During the signal integration phase the reference capacitor $C_R$ is charged by a circuit path from input terminal 6, switch I1-i, capacitor $C_R$ (connected between terminals 4 and 5), switch I1-j and analog ground at terminal 2.

During the second integration or reference deintegration stage a reference voltage of opposite polarity to the one appearing on the input signal $V_{in}$ is utilized to discharge the capacitor $C_I$. The selection of the polarity for the reference voltage ($V_R$ or $-V_R$) is made by the polarity detection circuit 102 which controls the analog switches $V_R$-k, or $-V_R$-1 and $-V_R$-m. The current path for the voltage signal is provided either from the reference source $V_R$ at terminal 6 or the previously charged reference capacitor $C_R$ depending upon the required polarity. The deintegration path is thus maintained through the auto-zero capacitor $C_{AZ}$, switch $\overline{AZ}$-f, amplifier 124, switch $\overline{AZ}$-g, resistor R, integrator 120 and comparator 126.

In accordance with the invention, the offset circuit 60 is connected to the summing junction of the amplifier 122 of the integrator 120. The offset current is thus fed via the FET 72 and line 74 to the terminal 26 of the A/D converter 52. Terminal 26 is directly connected to the amplifier 122 and capacitor $C_I$, and thus, the offset current is directly connected to the integrator 120. The offset current is gated via the NAND gate 82 which has one of its inputs controlled by the manually actuated switch means 84 and the other input connected to receive a signal integrate or ramp-up signal from the control logic circuit 104 of the A/D converter 52 via an output terminal 23. This ramp-up signal is also termed a print command or end of convert (EOC) signal since it occurs after the digital output of the A/D converter 52 has settled down and the data may thus be printed. The shape and timing of the ramp-up signal are illustrated adjacent line 94.

In operation, the offset current may be selected by means of the variable resistor 68 during the signal integration phase of operation by merely monitoring the digital display output of the digital meter 50. For example, digital panel meters may typically measure a 4-20 milliamp reading corresponding to zero to full scale wherein it is generally desirable to have a small current passing through sensors which are monitored to provide a positive indication of the proper operation of the sensors. The offset circuit may conveniently be utilized to add an appropriate negative current to the integrator so that the nominal 4 milliamp reading is zeroed. The interconnection of the offset current at the summing junction of the integrator is extremely advantageous inasmuch as a fixed number of counts may be easily provided as an offset (readable on the digital display output) without affecting the input impedance of the analog-to-digital converter. Further, the manual switch means 84 permits a simple single switch mechanism to either enable the offset circuit or inhibit its operation.

The offset circuit may also be utilized as a very stable, precise comparator if the offset voltage is selected to just trip the overrange indication of the digital display or the + or − polarity circuits when added to or subtracted from a desired signal level. It is recognized that offset signals may take the form of voltages or currents and, indeed, it is a simple matter to convert an offset voltage to an offset current and vice versa.

Although the invention has been described in terms of selected preferred embodiments, the invention should not be deemed limited thereto, since other embodiments and modifications will readily occur to one skilled in the art. It is, therefore, to be understood that the appended claims are intended to cover all such modifications as fall within the true spirit and scope of the invention.

What is claimed is:

1. In a dual slope analog-to-digital converter, said converter having an integrator and including means for generating a control signal responsive to an integrate operation, the improvement comprising:
   means for generating a user selectable offset signal for application to said integrator including:
   an offset signal source, said offset signal having a magnitude which is continuously variable by a user;
   means, selectable by a user, for selecting or disabling said offset signal;
   logic means, responsive to said integrate control signal and to said offset selecting means for generating a gating signal; and
   switch means, responsive to said gating signal, for applying said offset signal to an input of said integrator only during said integrate operation.

2. The device of claim 1 wherein said logic means comprises a logic gate having one input responsive to said offset selecting and disabling means, a second input responsive to said integrate control signal, and an output connected to an input of said switch means.

3. The device of claim 2 wherein said offset selecting and disabling means comprises switch means connected to an input of said logic gate and operative in a first user selectable position for enabling the application of said offset signal to said integrator, and operative in a second user selectable position for preventing the application of said offset signal to said integrator.

4. The device of claim 3 wherein said logic gate comprises a NAND gate having one input responsive to said integrate control signal and a second input connected via said user selectable switch means to either an offset enabling signal or an offset preventing signal.

5. The device of claim 1 wherein said offset signal source comprises an offset current source.

6. The device of claim 5 wherein said offset current source comprises a source of voltage whose polarity and magnitude are continuously variable and user selectable, and means connected to said voltage source for converting said voltage into an offset current.

7. The device of claim 1 wherein said switch means comprises a field effect transistor having a source and drain terminal respectively connected to said source of offset signals and to said input of said integrator, and having a gate terminal connected to said logic means to receive said gating signal.

* * * * *